(12) United States Patent
Yoshida et al.

(10) Patent No.: US 7,944,546 B2
(45) Date of Patent: May 17, 2011

(54) EXPOSURE APPARATUS AND DEVICE MANUFACTURING METHOD

(75) Inventors: Masatomi Yoshida, Utsunomiya (JP); Hiromichi Hara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 186 days.

(21) Appl. No.: 12/361,296

(22) Filed: Jan. 28, 2009

(65) Prior Publication Data

US 2009/0195767 A1 Aug. 6, 2009

(30) Foreign Application Priority Data

Feb. 4, 2008 (JP) ................................. 2008-024258

(51) Int. Cl.
*G03B 27/58* (2006.01)
*G03B 27/42* (2006.01)

(52) U.S. Cl. ........................................... 355/72; 355/53

(58) Field of Classification Search .................... 355/53, 355/72–76; 188/378–380; 267/34–35
See application file for complete search history.

(56) References Cited

U.S. PATENT DOCUMENTS

| | | | |
|---|---|---|---|
| 4,468,739 A * | 8/1984 | Woods et al. ................... | 701/37 |
| 5,040,431 A | 8/1991 | Sakino et al. | |
| 5,228,358 A | 7/1993 | Sakino et al. | |
| 5,524,502 A | 6/1996 | Osanai | |
| 6,322,060 B1 | 11/2001 | Mayama et al. | |
| 6,724,466 B2 * | 4/2004 | Ono et al. ........................ | 355/72 |
| 7,125,008 B2 * | 10/2006 | Hayashi et al. ................. | 267/34 |
| 2005/0211515 A1 * | 9/2005 | Hata et al. ................. | 188/266.7 |

FOREIGN PATENT DOCUMENTS

| | | |
|---|---|---|
| JP | 01-188241 A | 7/1989 |
| JP | 03-245932 A | 11/1991 |
| JP | 06-267823 A | 9/1994 |
| JP | 11-294520 A | 10/1999 |

\* cited by examiner

*Primary Examiner* — Hung Henry Nguyen (74) *Attorney, Agent, or Firm* — Canon U.S.A. Inc., IP Division (57) ABSTRACT

An exposure apparatus comprises a component configured to project a pattern of an original onto a substrate, a structure configured to support the component, a support configured to support the structure, a gas spring which is located between the structure and the support and configured to support the structure, and a stopper accommodated in an internal space of the gas spring so as to prevent the structure from moving relative to the support in excess of an allowable level.

12 Claims, 7 Drawing Sheets

EXPOSURE APPARATUS AND DEVICE MANUFACTURING METHOD

BACKGROUND OF THE INVENTION

1. Field of the Invention

The present invention relates to an exposure apparatus which projects the pattern of an original onto a substrate, thereby exposing the substrate to light, and a device manufacturing method.

2. Description of the Related Art

In manufacturing micropatterned devices such as a semiconductor device, liquid-crystal device, and micromachine, an exposure apparatus is used to project the pattern of an original (reticle) onto a substrate (for example, a wafer or glass plate), thereby exposing the substrate to light. Examples of the exposure light are visible light, ultraviolet light, EUV light, X-rays, an electron beam, and a charged-particle beam. Examples of a projection system for projecting the pattern of an original onto a substrate are a dioptric system, catoptric system, catadioptric system, and charged-particle lens.

The exposure apparatus is required to accurately align an original stage which holds an original and a substrate stage which holds a substrate. The exposure apparatus is also required to accurately support structures such as an optical system support which supports the projection system, an original stage surface plate which supports the original stage, and a substrate stage surface plate which supports the substrate stage.

Also, the exposure apparatus requires a vibration control device for suppressing any external vibration such as vibration transmitted from bases such as the floor on which the exposure apparatus is installed from being transmitted to, for example, the stages.

To meet this need, the structures such as the surface plates in the exposure apparatus are generally supported by foundation structures such as the floor through a vibration control mount. In this specification, "vibration control" means reducing vibration.

An active vibration control device which detects vibration by a sensor and operates an actuator based on the signal output from the sensor has already been put to practical use. It is a common practice to use, as the actuator for the active vibration control device, an air pressure actuator which regulates the pressure of the internal space of a gas spring, thereby actively controlling a thrust produced by this internal pressure.

To improve a function of reducing the vibration of the structure supported by the vibration control mount, it is effective to decrease the spring constant of the vibration control mount. Then, it is effective to use a gas spring as the vibration control mount. Because a gas spring can easily produce a large thrust by setting its pressure receiving area to be sufficiently large, it can also suitably be used as a support mechanism which supports a heavy structure. Hence, using an air pressure actuator as the actuator for the vibration control mount has a merit that it can also be exploited as the support mechanism, thus attaining a vibration control device having a relatively simple structure (see Japanese Patent Laid-Open No. 11-294520).

Conventionally, when the exposure apparatus is in a normal operative state (including various regulation processes for exposure), a vibration control mount including an air pressure actuator using a gas spring supports a structure in the exposure apparatus with respect to a foundation structure while reducing the vibration of the structure in the exposure apparatus. However, in assembly and regulation of the exposure apparatus, the structure in the exposure apparatus must be supported with respect to the foundation structure with a high rigidity to ensure safety. In this case, not the vibration control mount including a gas spring but a stopper or the like provided separately from the vibration control mount supports the structure in the exposure apparatus. If the exposure apparatus suffers an abnormality and therefore a sufficient amount of driving gas cannot be supplied to the air pressure actuator built in the vibration control mount, the vibration control mount including a gas spring can hardly support the structure in the exposure apparatus. Also in this case, a stopper or the like supports the structure in the exposure apparatus as in the above-described case. The same applies to a case in which signal transmission to the air pressure actuator is disabled or to be stopped.

The support position (the point of action) of the structure in the exposure apparatus changes between when the gas spring supports the structure and when the stopper supports the structure, so its gravitational deformation characteristic changes between the two cases. In one example, the support position changes between when the vibration control mount supports an optical system support which mounts an interferometer and a projection system for the exposure apparatus and when the stopper or the like supports the optical system support, so the deformation characteristic of the optical system support may change on the order of several micrometers.

When a structure in the exposure apparatus mounts two components while being supported by a stopper, and is then supported by a gas spring, the positional relationship between these two components may change. More specifically, when the optical system support mounts a projection system and interferometer while being supported by a stopper, and is then supported by a vibration control mount, the distance between the projection system and the interferometer may change on the order of several micrometers.

Along with the recent increase in the size of the exposure apparatus, the sizes of the structures in the exposure apparatus are also increasing. To decrease the weight of the exposure apparatus, it is necessary to minimize the weights of the structures. To meet this need, the structures in the exposure apparatus are desirably imparted with minimum necessary rigidities while the exposure apparatus is in a normal state, that is, they are supported by vibration control mounts. From this viewpoint, the amount of change in the positional relationship between components due to change in the support position as described above may increase. However, in recent years, considering a demand for a higher accuracy of the exposure apparatus, a change in the positional relationship between components due to change in the support position is non-negligible.

When two components mounted on a structure must be aligned precisely, a process of re-adjusting the positions of the components after mounting them on the structure is necessary. This increases the number of assembly processes and the cost.

The deformation characteristic of a structure in the exposure apparatus changes between when a gas spring supports the structure and when the stopper supports it, so a strain remains in the structure itself or the components mounted on the structure. For example, even when the support position is returned to the original support position, the components may not return to the initial states (for example, the initial position and deformation state) owing to an irreversible effect such as friction. More specifically, when an optical system support mounts a projection optical system while being supported by a stopper, is then temporarily supported by a gas spring, and is supported by the stopper again, the position and deformation state of the projection system may change from the initial state upon mounting.

Along with the recent increase in the accuracy of the exposure apparatus, the number of components in the exposure apparatus is increasing. Considering the limiting condition of the installation space of the exposure apparatus, it is necessary to save the spaces to accommodate the components. This makes it difficult to ensure sufficient spaces to accommodate the stoppers.

Also along with the recent increase in the accuracy of the exposure apparatus, it is demanded to clean the environment in the exposure apparatus and precisely control the temperature in the exposure apparatus. To meet this demand, when a drivable stopper is used, dust, waste heat, and the like released from a stopper driving mechanism to the environment in the exposure apparatus are becoming non-negligible.

SUMMARY OF THE INVENTION

The present invention contributes to, for example, reducing a difference in support position between when a gas spring supports a structure and when a stopper supports it.

According to the first aspect of the present invention, there is provided an exposure apparatus including a component configured to project a pattern of an original onto a substrate, thereby exposing the substrate to light, and a structure configured to support the component, the apparatus comprising a support configured to support the structure, a gas spring which is located between the structure and the support and configured to support the structure, and a stopper accommodated in an internal space of the gas spring so as to prevent the structure from moving relative to the support in excess of an allowable level.

According to the second aspect of the present invention, there is provided a device manufacturing method comprising the steps of exposing a substrate to light by using the above-mentioned exposure apparatus, and developing the substrate.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

An exposure apparatus according to a preferred embodiment of the present invention includes components to project the pattern of an original onto a substrate, thereby exposing the substrate to light, and structures to support the components. The components include, for example, a projection system (optical system barrel), original stage, and substrate stage. The structures include, for example, an optical system support, original stage surface plate, and substrate stage surface plate.

Figure 2:
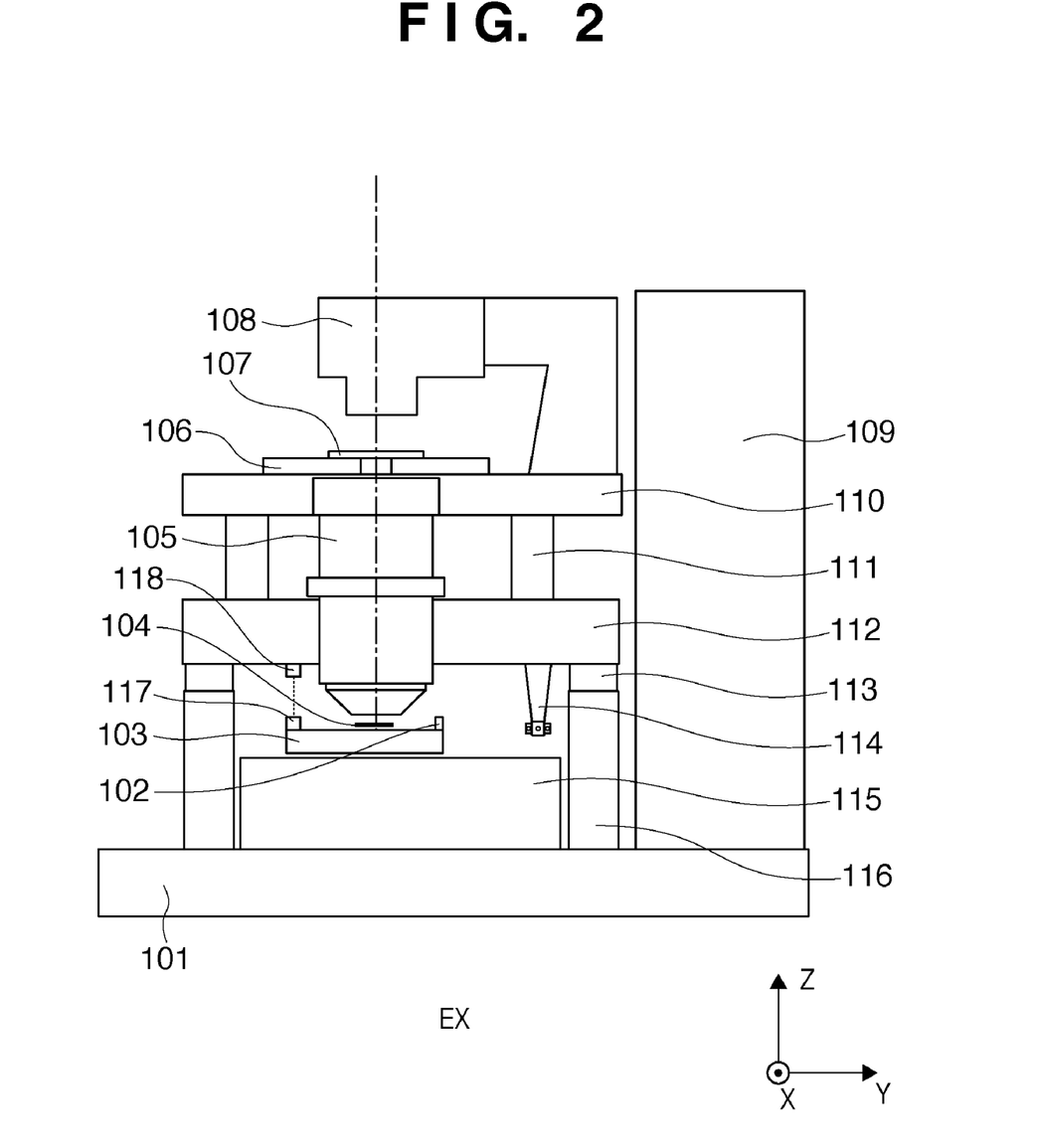
FIG. 2 is a view showing the schematic arrangement of an exposure apparatus according to a preferred embodiment of the present invention.

FIG. 2 is a view showing the schematic arrangement of an exposure apparatus according to a preferred embodiment of the present invention. An exposure apparatus EX scans an original (reticle) 107 and a substrate (for example, a wafer or glass plate) 104 with respect to a projection system 105 while projecting the pattern of the original 107 onto the substrate 104 by the projection system 105. With this operation, the substrate 104 is exposed to light, and the pattern of the original 107 is transferred onto the substrate 104. However, the exposure apparatus EX may expose the substrate 104 to light while the original 107 and substrate 104 stand still.

The exposure apparatus EX includes a base frame 116 serving as a support which supports an optical system support 112, an original stage (reticle stage) 106 which can move while holding the original 107, and a substrate stage (wafer stage) 103 which can move while holding the substrate 104. The exposure apparatus EX also includes an illumination system 108 which illuminates the original 107 with illumination light, the projection system 105 which projects the pattern of the original 107 onto the substrate 104 at a predetermined magnification (for example, 4:1), and the optical system support 112 which holds the projection system 105. The exposure apparatus EX also includes an air-conditioning room 109 which supplies temperature-controlled clean air to spaces such as the optical paths (for example, the interiors of the illumination system 108 and projection system 105).

The illumination system 108 introduces illumination light by building a light source (for example, an electric-discharge lamp such as a superhigh pressure mercury lamp) in itself or by guiding light from a light source (for example, an excimer laser; not shown) set to be spaced apart from the main body (in this case, a portion other than the light source) of the exposure apparatus EX via a beam line. The illumination system 108 generates, for example, slit light and illuminates the original 107 held by the original stage 106.

The base frame 116 is installed on a floor (base) 101 of a clean room in a semiconductor manufacturing facility. The base frame 116 is fixed on the floor 101 with a high rigidity, so it is practically integrated with the floor 101 or is practically an extension of the floor 101. The base frame 116 typically includes three or four high-rigidity columns and supports the optical system support (an example of the structures) 112 on the upper portion of each column through a vibration control mount 113. The vibration control mount 113 includes, for example, a gas spring, damper, and actuator. The vibration control mount 113 prevents high-frequency vibration (vibration having a frequency equal to or higher than the natural frequency of the floor 101) from the floor 101 from being transmitted to the optical system support 112, and actively compensates the tilt and shaking of the optical system support 112.

The optical system support 112 which supports the projection system 105 supports an original stage surface plate 110 through a support frame 111. To detect the position of the substrate stage 103 with reference to the optical system support 112, laser interferometers are fixed on the optical system support 112. The laser interferometers include a Z interferometer 118 which measures the position of the substrate stage 103 in the Z direction (vertical direction), and an X-Y interferometer 114 which measures the position of the substrate stage 103 in the X and Y directions (horizontal direction). As reference mirrors for the laser interferometers, a Z interferometer mirror 117 and X-Y interferometer mirror 102 are arranged on the substrate stage 103.

The original stage 106 is installed on the original stage surface plate 110 and driven in the Y direction in scanning exposure by a driving mechanism (not shown) including a driving source (linear motor) and hydrostatic bearing. The driving profile at this time can include an acceleration interval, constant-velocity movement interval, and deceleration interval in the order named.

The substrate stage 103 and its periphery will be explained next. The substrate stage 103 holds the substrate 104 mounted on it, and can be aligned in a total of six axial directions, that is, the two directions (X and Y directions) on the horizontal plane, the vertical direction (Z direction), and the rotation (ωx, ωy, and ωz) directions about axes parallel to the respective directions. An electromagnetic actuator such as a linear motor can be adopted as an alignment driving source. An alignment mechanism which aligns the substrate stage 103 includes a two-dimensional stage mechanism including an X stage which rectilinearly moves in the X direction, an X linear motor which drives it, a Y stage which rectilinearly moves in the Y direction, and a Y linear motor which drives it. The alignment mechanism has a structure in which stages which can move in the Z direction, the tilt (ωx and ωy) directions, and the rotation directions are mounted on the two-dimensional stage mechanism. A hydrostatic bearing is used as a guide in each direction. The detailed arrangement of the substrate stage 103 is described in, for example, Japanese Patent Laid-Open Nos. 1-188241, 3-245932, and 6-267823.

The substrate stage 103 is supported by a substrate stage surface plate 115 and moves on the X-Y guide surface of the substrate stage surface plate 115. The substrate stage surface plate 115 can be supported by a base such as the floor through support legs (not shown) or by the base frame (support) 116.

Figure 3:
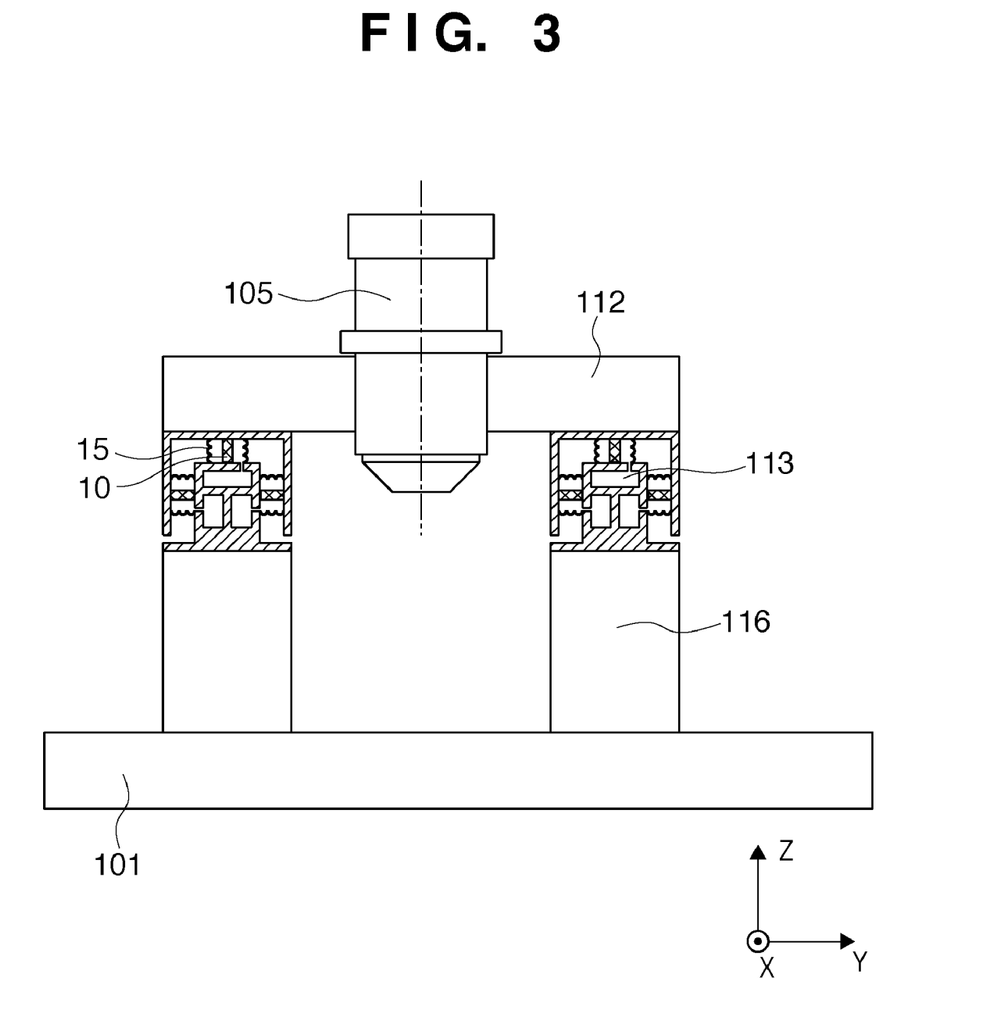
FIG. 3 is a view showing a partial structure including a vibration control mount, of the structure shown in FIG. 2.

FIG. 3 is a view showing a partial structure including the vibration control mount 113, of the structure shown in FIG. 2. The optical system support 112 which supports the projection system 105 is supported by the base frame 116 through the vibration control mount 113 and by the floor (base) 101 as well.

Figure 1:
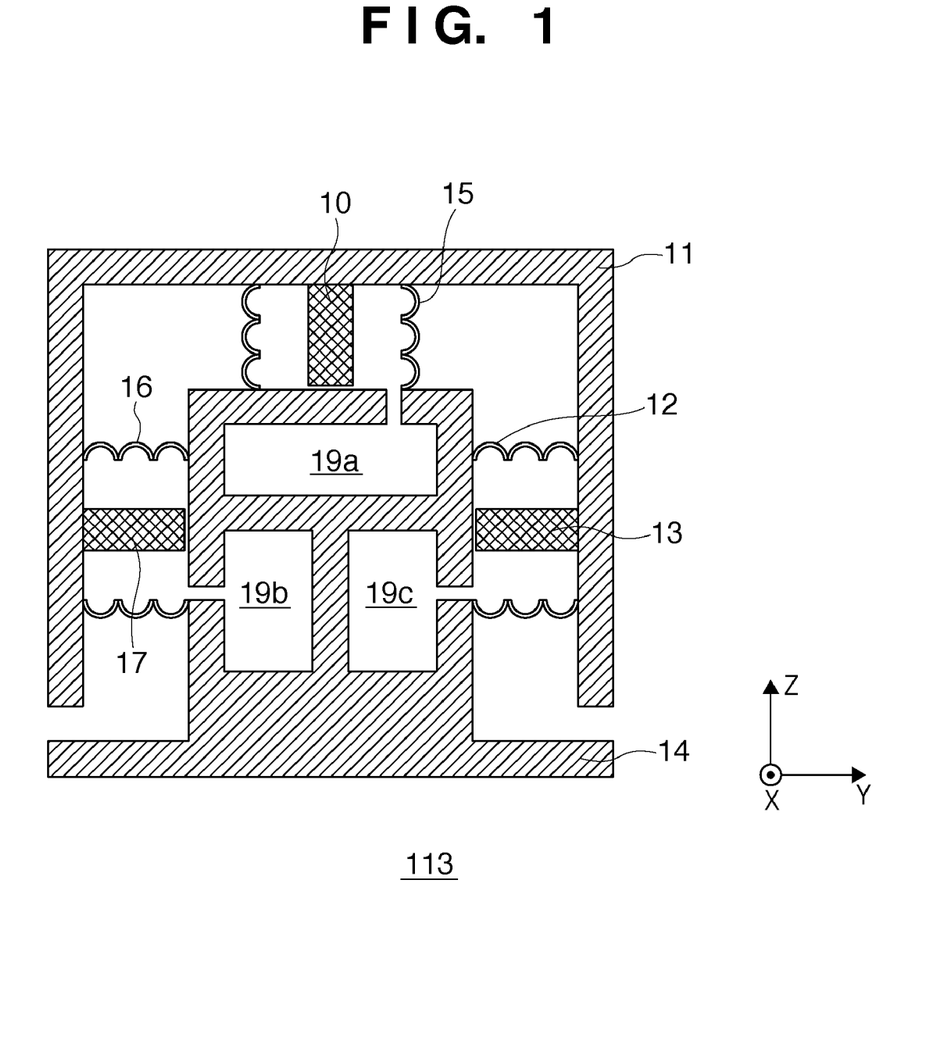
FIG. 1 is a view schematically showing the structure of a vibration control mount in an exposure apparatus according to the first embodiment of the present invention.

FIG. 1 is a view schematically showing the structure of a vibration control mount 113 in an exposure apparatus according to the first embodiment of the present invention. The vibration control mount 113 includes a movable portion 11 and a fixed portion 14 fixed on a base frame (support) 116 which supports an optical system support 112. The movable portion 11 has an opening at its bottom portion and can be a box-shaped member which surrounds at least a part of the fixed portion 14.

Referring to FIG. 1, as an arrangement which supports the movable portion 11 in the Z direction, a gas spring 15 which can expand and contract in the Z direction is located between the outer surface of the fixed portion 14 and the inner surface of the box-shaped movable portion (box-shaped member) 11. The gas spring 15 supports the optical system support 112 in the Z direction in cooperation with a space 19a formed in the fixed portion 14. The gas spring 15 can typically be an air spring.

Also referring to FIG. 1, as an arrangement which supports the movable portion 11 in the Y direction, gas springs 12 and 16 which can expand and contract in the Y direction are located between the movable portion 11 and the fixed portion 14. The gas springs 12 and 16 are arranged to sandwich the movable portion 11 between themselves. The gas springs 12 and 16 support the optical system support 112 in the Y direction in cooperation with spaces 19c and 19b, respectively, formed in the fixed portion 14. The gas springs 15, 12, and 16 can be formed from, for example, rubber.

The spaces 19a, 19b, and 19c are connected to a pressure regulating mechanism (not shown) through pipe lines. The pressure regulating mechanism individually controls the internal pressures of the spaces 19a, 19b, and 19c in order to reduce the vibration of the optical system support 112.

A Z-direction stopper 10 which restricts the position of the movable portion 11 in the Z direction is accommodated in the gas spring 15 which supports the movable portion 11 in the Z direction. Y-direction stoppers 13 and 17 which restrict the position of the movable portion 11 in the Y direction are accommodated in the gas springs 12 and 16, respectively, which support the movable portion 11 in the Y direction. The stoppers 10, 13, and 17 prevent the movable portion 11 or the optical system support 112 (structure) from moving relative to the fixed portion 14 or a floor (base) 101 in excess of an allowable level. The stoppers 10, 13, and 17 are also used to support the optical system support 112 in assembly and regulation of the exposure apparatus.

If the gas spring 15 cannot support the optical system support 112 as the internal pressure of the gas spring 15 is controlled to a prescribed value or less, the optical system support 112 is supported by the Z-direction stopper 10 accommodated in the internal space of the gas spring 15. For this reason, the support position of the optical system support 112 does not change largely between when the gas spring 15 supports the optical system support 112 and when the stopper 10 supports the optical system support 112. The deformation state of the optical system support 112, in turn, does not change largely. The positional relationship among a plurality of components (for example, a projection system 105 and interferometers 114 and 118) mounted on the optical system support 112 also does not change largely between when the gas spring 15 supports the optical system support 112 and when the Z-direction stopper 10 supports the optical system support 112. In addition, residual strain in the individual components mounted on the optical system support 112 is reduced.

Figure 4:
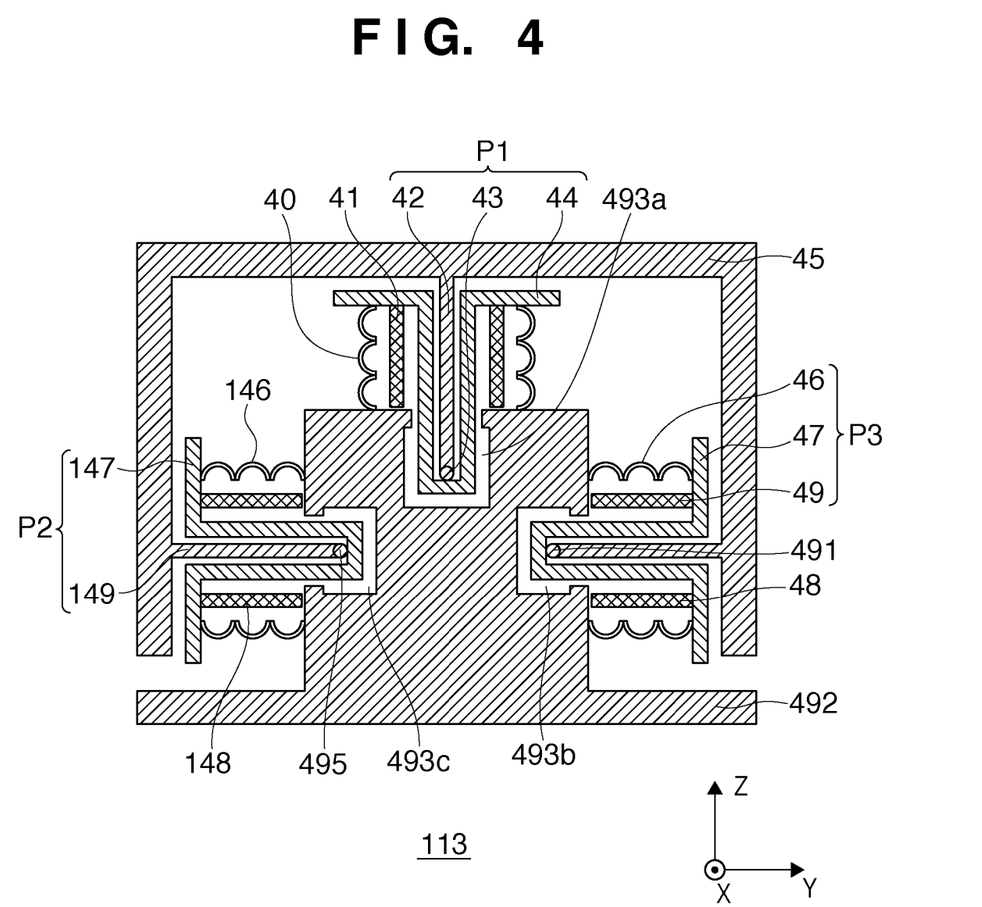
FIG. 4 is a view schematically showing the structure of a vibration control mount in an exposure apparatus according to the second embodiment of the present invention.

FIG. 4 is a view schematically showing the structure of a vibration control mount 113 in an exposure apparatus according to the second embodiment of the present invention. The exposure apparatus according to the second embodiment has an arrangement in which the vibration control mount 113 shown in FIG. 1 in the exposure apparatus according to the first embodiment is substituted by the vibration control mount 113 shown in FIG. 4.

The vibration control mount 113 includes a box-shaped movable portion (box-shaped member) 45 having an opening at its bottom portion, and a fixed portion 492 fixed on a base frame 116 which supports an optical system support 112. The movable portion 45 is fixed on the optical system support 112.

The movable portion 45 has, at the center of its inner surface, a piston rod 42 of a gimbal piston serving as a mechanism which tolerates a relative misalignment between the movable portion 45 and the fixed portion 492 in a direction parallel to the X-Y plane. The piston rod 42 extends in the Z direction. The piston rod 42 is supported on the bottom surface of a cylinder 44 of the gimbal piston through a metal ball 43 arranged at the distal end of the piston rod 42. With this arrangement, the gimbal piston has a structure flexible in a direction parallel to the X-Y plane.

Also referring to FIG. 4, as an arrangement which supports a movable portion 11 in the Z direction, a gas spring 40 which can expand and contract in the Z direction is located between the fixed portion 492 and a gimbal piston P1 to form an enclosed space. The gas spring 40 supports the optical system support 112 in the Z direction in cooperation with a space 493*a* formed in the fixed portion 492. The gas spring 40 can typically be an air spring. The gas spring 40 has a higher rigidity in a direction parallel to the X-Y plane perpendicular to the Z direction than that in the Z direction. For this reason, although the gas spring 40 prohibits relative movement between the movable portion 45 and the fixed portion 492 in a direction parallel to the X-Y plane, the gimbal piston P1 enables their relative movement in a direction parallel to the X-Z plane.

The movable portion 45 has, at the centers of its inner side surfaces, piston rods 49 and 149 of gimbal pistons P2 and P3 each serving as a mechanism which tolerates a relative misalignment between the movable portion 45 and the fixed portion 492 in a direction parallel to the X-Z plane. The piston rods 49 and 149 extend in the Y direction. The piston rods 49 and 149 are supported on the bottom surfaces of cylinders 47 and 147 of the gimbal pistons P2 and P3 though metal balls 491 and 495 arranged at the distal ends of the piston rods 49 and 149. With this arrangement, the gimbal pistons P2 and P3 have a structure flexible in a direction parallel to the X-Z plane.

Also referring to FIG. 4, as an arrangement which supports the movable portion 11 in the Y direction, gas springs 46 and 146 which can expand and contract in the Y direction are located between the fixed portion 492 and the gimbal pistons P2 and P3 to form enclosed spaces. The gas springs 46 and 146 support the optical system support 112 in the Y direction in cooperation with spaces 493*b* and 493*c*, respectively, formed in the fixed portion 492. The gas springs 46 and 146 can typically be, for example, air springs. The gas springs 46 and 146 have a higher rigidity in a direction parallel to the X-Z plane perpendicular to the Y direction than that in the Y direction. For this reason, although the gas springs 46 and 146 prohibit relative movement between the movable portion 45 and the fixed portion 492 in a direction parallel to the X-Z plane, the gimbal pistons P2 and P3 enable their relative movement in a direction parallel to the X-Z plane.

Note that a gimbal piston may be located between the fixed portion 492 and the movable portion 45 in the X direction, and, as an arrangement which supports the movable portion 11 in the X direction, a gas spring which can expand and contract in the X direction may be located between the movable portion 45 and the gimbal piston to form an enclosed space.

The spaces 493*a*, 493*b*, and 493*c* are connected to a pressure regulating mechanism (not shown) through pipe lines. The pressure regulating mechanism individually controls the internal pressures of the spaces 493*a*, 493*b*, and 493*c* in order to reduce the vibration of the optical system support 112.

A Z-direction stopper 41 which restricts the position of the movable portion 45 in the Z direction is accommodated in the gas spring 40 which supports the movable portion 45 in the Z direction. Y-direction stoppers 48 and 148 which restrict the position of the movable portion 45 in the Y direction are accommodated in the gas springs 46 and 146, respectively, which support the movable portion 45 in the Y direction. The stoppers 41, 48, and 148 prevent the movable portion 11 or the optical system support 112 (structure) from moving relative to a fixed portion 14 or a floor (base) 101 in excess of an allowable level.

If the gas spring 40 cannot support the optical system support 112 as the amount of gas (or the pressure) in the gas spring 40 becomes equal to or less than a prescribed amount, the optical system support 112 is supported by the Z-direction stopper 41. For this reason, the deformation state of the optical system support 112 does not change largely between when the gas spring 40 supports the optical system support 112 and when the Z-direction stopper 41 supports the optical system support 112.

Figure 5:
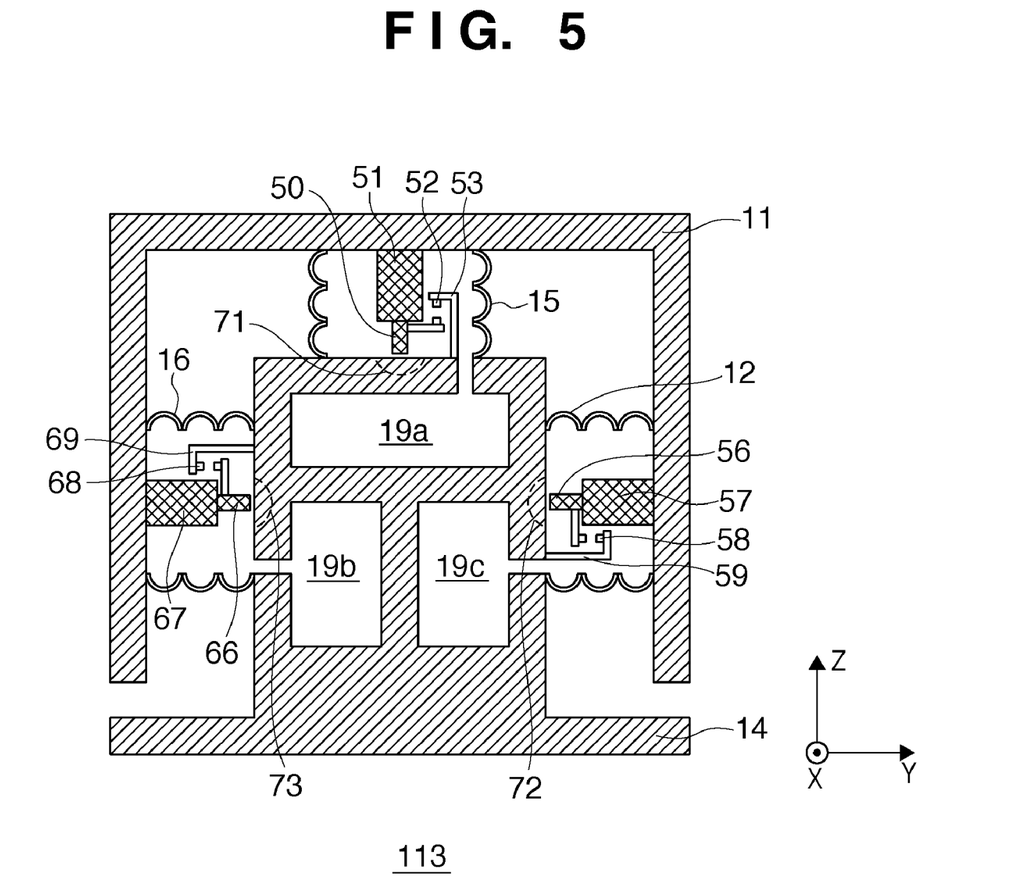
FIG. 5 is a view schematically showing the structure of a vibration control mount in an exposure apparatus according to the third embodiment of the present invention.

FIG. 5 is a view schematically showing the structure of a vibration control mount 113 in an exposure apparatus according to the third embodiment of the present invention. The exposure apparatus according to the third embodiment has an arrangement in which the vibration control mount 113 shown in FIG. 1 in the first embodiment is substituted by the vibration control mount 113 shown in FIG. 5.

In the third embodiment, a stopper 50 accommodated in the internal space of a gas spring 15 is driven by an actuator 51. Likewise, a stopper 56 accommodated in the internal space of a gas spring 12 is driven by an actuator 57. A stopper 66 accommodated in the internal space of a gas spring 16 is driven by an actuator 67. The actuators 51, 57, and 67 which drive the stoppers 50, 56, and 66 can be typically accommodated in the internal spaces of the gas springs 15, 12, and 16, respectively. This arrangement can reduce the adverse influence that dust and heat that may be generated by the actuators 51, 57, and 67 inflict on the environment inside the chamber of the exposure apparatus. The actuator 51 in the Z direction may drive the stopper 50 to prevent the level of the optical system support 112 from changing between when the gas spring 15 supports an optical system support 112 and when the stopper 50 supports the optical system support 112.

The actuators 51, 57, and 67 can include, for example, piezoelectric elements or magnetostrictive elements. The allowable level of movement of a movable portion 11 or the optical system support 112 (structure) relative to a fixed portion 14 or a floor (base) 101 can be changed in accordance with the amounts of driving of the stoppers 50, 56, and 66 by the actuators 51, 57, and 67. In the example shown in FIG. 5, the allowable value is determined in accordance with the distances between the distal ends of the stoppers 50, 56, and 66 and stopper receptacles 71, 72, and 73 which receive them. Also in the example shown in FIG. 5, the actuators 51, 57, and 67 which drive the stoppers 50, 56, and 66, respectively, are fixed on the movable portion 11, and the stopper receptacles 71, 72, and 73 are formed in the fixed portion 14. However, the actuators 51, 57, and 67 which drive the stoppers 50, 56, and 66, respectively, may be fixed on the fixed portion 14, and the stopper receptacles 71, 72, and 73 may be formed in the movable portion 11.

In the third embodiment, the vibration control mount 113 includes, in the internal spaces of the gas springs 15, 12, and 16, displacement sensors 52, 58, and 68, respectively, which detect the sizes of the gaps between the distal ends of the stoppers and portions opposing them. The displacement sensors 52, 58, and 68 can be interpreted as relative position sensors which detect the relative position between the fixed portion 14 and the optical system support 112 serving as the structure. The displacement sensor 52 can be supported by a support member 53 and accommodated in the internal space of the gas spring 15. The displacement sensor 58 can be supported by a support member 59 and accommodated in the internal space of the gas spring 12. The displacement sensor 68 can be supported by a support member 69 and accommodated in the internal space of the gas spring 16.

The actuators 51, 57, and 67 can be controlled based on the outputs from the displacement sensors 52, 58, and 68 so that the distances between the distal ends of the stoppers 50, 56, and 66 and the stopper receptacles 71, 72, and 73 correspond to the allowable level.

The exposure apparatus preferably further includes a vibration sensor which detects the vibration of the floor (base) 101 which supports the exposure apparatus. The actuators 51, 57, and 67 can be controlled so as to decrease the allowable level if the vibration sensor has detected vibration in excess of a prescribed value. Alternatively, the actuators 51, 57, and 67 may be controlled so that the fixed portion 14 supports the optical system support 112 through the stoppers 50, 56, and 66 (especially, the Z-direction stopper 50) if the vibration sensor has detected vibration in excess of a prescribed value.

Figure 6:
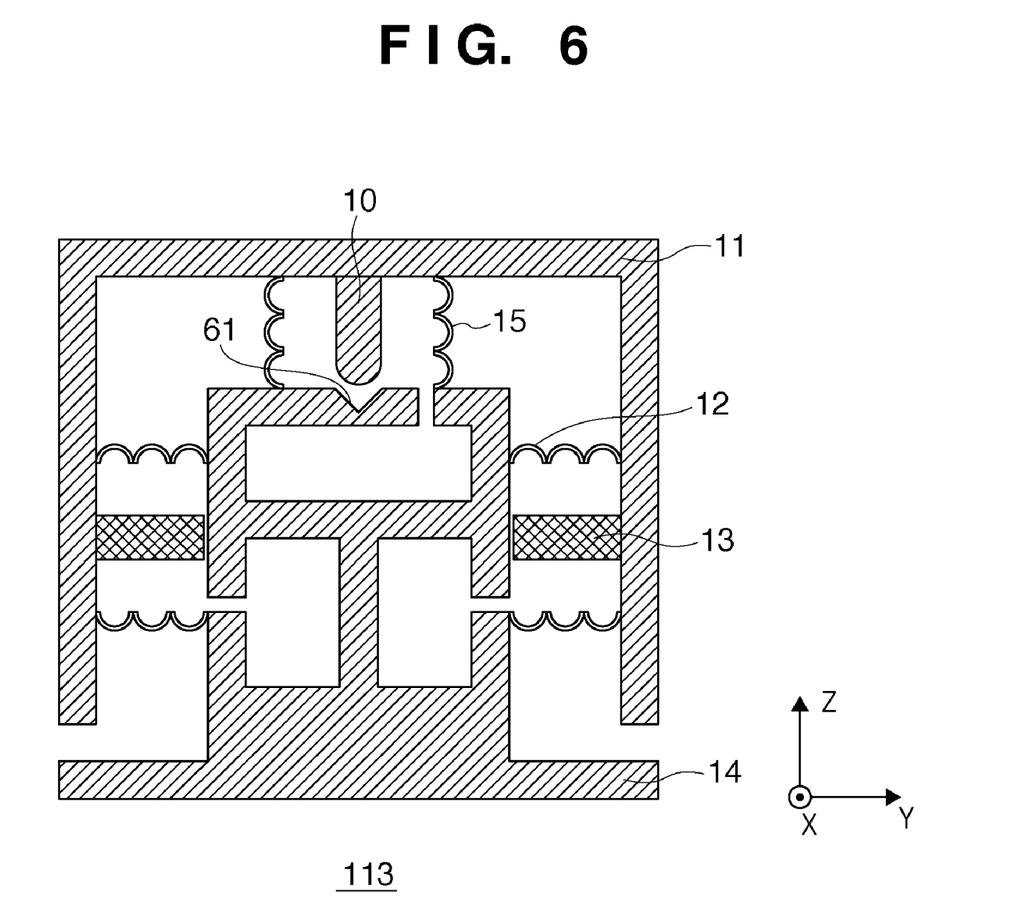
FIG. 6 is a view schematically showing the structure of a vibration control mount in an exposure apparatus according to the fourth embodiment of the present invention.

FIG. 6 is a view schematically showing a vibration control mount 113 in an exposure apparatus according to the fourth embodiment of the present invention. The exposure apparatus according to the fourth embodiment has an arrangement in which a kinematic holding mechanism 61 is added to the vibration control mount 113 in the exposure apparatus according to any one of the first to third embodiments. FIG. 6 illustrates an arrangement in which a kinematic holding mechanism 61 is added to the vibration control mount 113 according to the first embodiment as one example. In this case, a support frame includes three columns.

The kinematic holding mechanism 61 is typically formed in a stopper receptacle which receives a Z-direction stopper 10, and restricts the position of an optical system support 112 serving as the structure in the X and Y directions (horizontal direction) in supporting the optical system support 112 by the stopper 10. A combination of a V-shaped groove, a flat surface, and a conical groove, for example, is used as the kinematic holding mechanism 61. However, the present invention is not particularly limited to this, and a known kinematic holding mechanism can be adopted.

Figure 7:
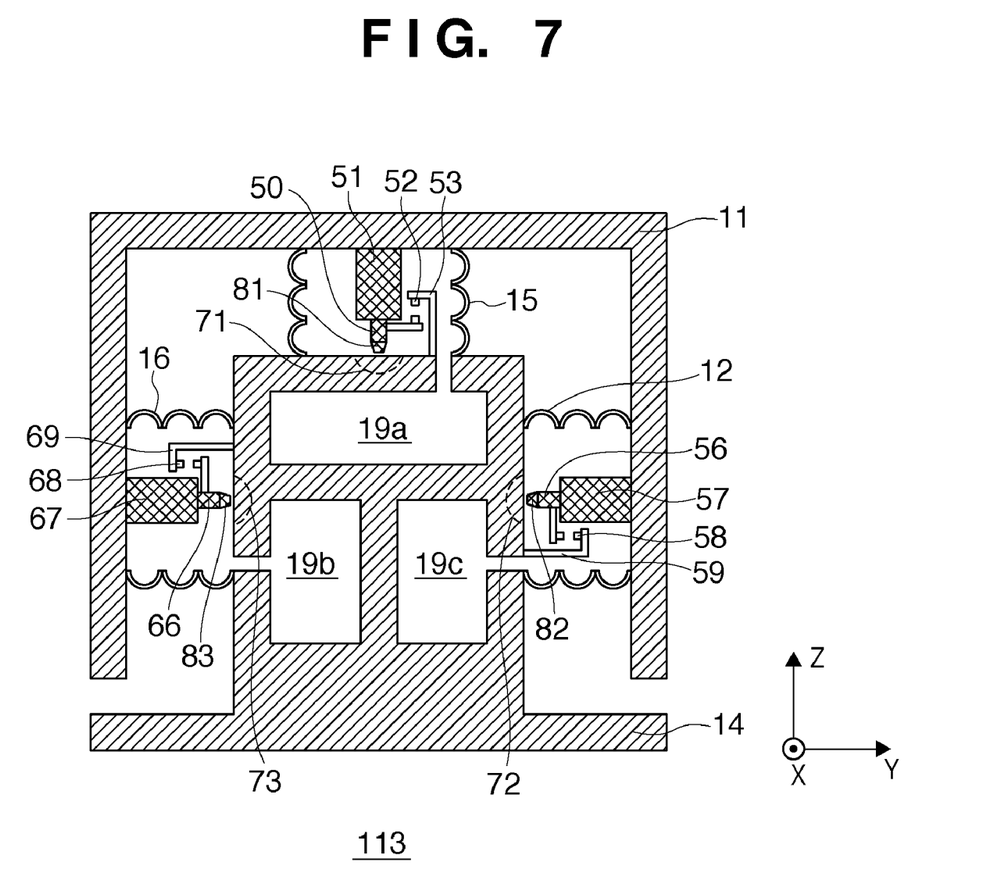
FIG. 7 is a view schematically showing the structure of a vibration control mount in an exposure apparatus according to the fifth embodiment of the present invention.

FIG. 7 is a view schematically showing the structure of a vibration control mount 113 in an exposure apparatus according to the fifth embodiment of the present invention. The exposure apparatus according to the fifth embodiment has an arrangement in which shock-absorbing members 81, 82, and 83 are added to the vibration control mount 113 in the exposure apparatus according to any one of the first to fourth embodiments. FIG. 7 illustrates an arrangement in which shock-absorbing members 81, 82, and 83 are added to the vibration control mount 113 according to the third embodiment as one example.

The shock-absorbing members 81, 82, and 83 reduce the shock of collision between stoppers 50, 56, and 66 and stopper receptacles 71, 72, and 73 which receive them as the stoppers restrict the position of an optical system support 112. The shock-absorbing members 81, 82, and 83 may be arranged at the distal ends of the stoppers 50, 56, and 66 (portions opposing the stopper receptacles 71, 72, and 73) or located in the stopper receptacles 71, 72, and 73. Although rubber, for example, is preferably used as the materials of the shock-absorbing members, the present invention is not particularly limited to this, and ceramics or a metal may be used.

A device manufacturing method according to the preferred embodiments of the present invention is suitable for the manufacture of devices (e.g., a semiconductor device and liquid crystal device). This method can include a step of exposing a substrate coated with a photoresist to light by using the above exposure apparatus, and a step of developing the substrate exposed in the exposing step. In addition to the above steps, the device manufacturing method can include other known steps (e.g., oxidation, film forming, evaporation, doping, planarization, etching, resist removing, dicing, bonding, and packaging steps).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-024258, filed Feb. 4, 2008, which is hereby incorporated by reference herein in its entirety.

What is claimed is:

1. An exposure apparatus including a component configured to project a pattern of an original onto a substrate, thereby exposing the substrate to light, and a structure configured to support the component, the apparatus comprising:
   a support configured to support the structure;
   a gas spring which is located between the structure and said support and configured to support the structure;
   a stopper accommodated in an internal space of said gas spring so as to prevent the structure from moving relative to said support in excess of an allowable level;
   an actuator configured to drive said stopper, wherein the allowable level is changed in accordance with an amount of driving of said stopper by said actuator; and
   a relative position sensor configured to detect a relative position between the structure and said support, wherein said actuator is controlled based on the output from said relative position sensor.

2. The apparatus according to claim 1, further comprising a gimbal piston,
   wherein said gas spring supports the structure through said gimbal piston.

3. The apparatus according to claim 1, further comprising a shock-absorbing member configured to reduce shock of collision between said stopper and a stopper receptacle which receives said stopper as said stopper restricts a position of the structure.

4. The apparatus according to claim 1, wherein the stopper receptacle which receives said stopper includes a kinematic holding mechanism.

5. The apparatus according to claim 4, wherein said kinematic holding mechanism is configured to define a position of the structure in a horizontal direction.

6. The apparatus according to claim 1, further comprising a vibration sensor configured to detect vibration of a base which supports the exposure apparatus,
   wherein if said vibration sensor has detected vibration in excess of a prescribed value, said actuator is controlled so as to decrease the allowable level or so that said support supports the structure through said stopper.

7. A device manufacturing method comprising the steps of:
   exposing a substrate to light by using an exposure apparatus; and
   developing the substrate,
   wherein the exposure apparatus comprises:
   a component configured to project a pattern of an original onto a substrate, thereby exposing the substrate to light;
   a structure configured to support the component:
   a support configured to support the structure;
   a gas spring which is located between the structure and said support and configured to support the structure;
   a stopper accommodated in an internal space of said gas spring so as to prevent the structure from moving relative to said support in excess of an allowable level;
   an actuator configured to drive said stopper, wherein the allowable level is changed in accordance with an amount of driving of said stopper by said actuator; and
   a relative position sensor configured to detect a relative position between the structure and said support, wherein said actuator is controlled based on the output from said relative position sensor.

8. The method according to claim 7, wherein the exposure apparatus further comprises a gimbal piston, and
wherein said gas spring supports the structure through said gimbal piston.

9. The method according to claim 7, wherein the exposure apparatus further comprises a shock-absorbing member configured to reduce shock of collision between said stopper and a stopper receptacle which receives said stopper as said stopper restricts a position of the structure.

10. The method according to claim 7, wherein the stopper receptacle which receives said stopper includes a kinematic holding mechanism.

11. The method according to claim 10, wherein said kinematic holding mechanism is configured to define a position of the structure in a horizontal direction.

12. The method according to claim 7, wherein the exposure apparatus further comprises a vibration sensor configured to detect vibration of a base which supports the exposure apparatus,
wherein if said vibration sensor has detected vibration in excess of a prescribed value, said actuator is controlled so as to decrease the allowable level or so that said support supports the structure through said stopper.

* * * * *